United States Patent
Wu et al.

(10) Patent No.: US 12,369,315 B2
(45) Date of Patent: Jul. 22, 2025

(54) SEMICONDUCTOR STRUCTURE HAVING SILICIDE LAYER DISPOSED ON SIDEWALLS OF THE BITLINE

(71) Applicant: ChangXin Memory Technologies, Inc., Hefei (CN)

(72) Inventors: Tieh-Chiang Wu, Hefei (CN); Lingxin Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/795,121

(22) PCT Filed: Jun. 1, 2022

(86) PCT No.: PCT/CN2022/096596
§ 371 (c)(1),
(2) Date: Jul. 25, 2022

(87) PCT Pub. No.: WO2023/226071
PCT Pub. Date: Nov. 30, 2023

(65) Prior Publication Data
US 2024/0215226 A1      Jun. 27, 2024

(30) Foreign Application Priority Data
May 23, 2022   (CN) .......................... 202210560956.1

(51) Int. Cl.
*H10B 12/00*   (2023.01)
(52) U.S. Cl.
CPC ........... *H10B 12/485* (2023.02); *H10B 12/03* (2023.02)
(58) Field of Classification Search
CPC ...... H10B 12/00; H10B 12/03; H10B 12/482; H10B 12/485

(Continued)

(56) References Cited

U.S. PATENT DOCUMENTS

2011/0278726 A1* 11/2011 Kim .................. H01L 21/76831
                                                                257/757

FOREIGN PATENT DOCUMENTS

CN          111584432 A     8/2020
KR    10-2012-003741 A     1/2019

OTHER PUBLICATIONS

PCT/CN2022/096596 International Search Report mailed Dec. 22, 2022.

* cited by examiner

*Primary Examiner* — Hoai V Pham
(74) *Attorney, Agent, or Firm* — Kilpatrick Townsend & Stockton LLP

(57) ABSTRACT

A semiconductor structure and a method making it are disclosed. The method includes: providing a substrate, and sequentially forming a bitline contact structure and a bitline on the substrate; the bitline includes a connection layer connected to the bitline contact structure. The bitline contact structure and the sidewalls of the connection layer are etched back. A first silicide layer covering the sidewalls of the bitline contact structure, and a second silicide layer covering the sidewalls of the connection layer are formed. This structure can reduce the contact resistance between the bitline contact structure and the bitline, as well as the parasitic capacitance between the bitline contact structure and the adjacent conductive structures, thereby improving the electrical performance and reliability of the semiconductor structure and improving the semiconductor yield.

7 Claims, 10 Drawing Sheets

(58) Field of Classification Search
USPC .......................................... 257/906, 907, 908
See application file for complete search history.

SEMICONDUCTOR STRUCTURE HAVING SILICIDE LAYER DISPOSED ON SIDEWALLS OF THE BITLINE

CROSS REFERENCES TO RELATED APPLICATIONS

This disclosure claims the priority of a Chinese patent with application number 202210560956.1, and entitled "Semiconductor Structure and Method of Making the Same", filed with the China National Intellectual Property Administration on May 23, 2022, the entire contents of which are incorporated herein by reference Public.

TECHNICAL FIELD

The present disclosure relates to the technical field of semiconductor integrated circuit manufacturing, and in particular, to a semiconductor structure and a preparation method thereof.

BACKGROUND

Dynamic Random Access Memory (DRAM) is a type of semiconductor storage device commonly used in electronic devices such as computers, and includes multiple storage units. One storage unit includes: a storage capacitor and a transistor electrically connected to the storage capacitor. A transistor includes a gate, source and drain regions. The gates of the transistors are used for electrical connection with the word lines. The source region of the transistor is used to form a bitline contact region to be electrically connected to the bitline through the bitline contact structure. The drain region of the transistor is used to form a storage node contact region to be electrically connected to the storage capacitor through the storage node contact structure.

However, with the development of semiconductor technology, the feature sizes of devices in integrated circuits are getting smaller and smaller. After the semiconductor process enters the deep sub-micron stage, the sizes of the DRAMs are getting smaller and smaller, and the sizes of the bitline contact structures and the bitline are also reduced accordingly. A large parasitic capacitance between the line contact structures and the adjacent conductive structures occurs, which adversely affects the electrical performance of the semiconductor device.

SUMMARY

According to various embodiments of the present disclosure, a semiconductor structure and a method of fabricating it are provided.

According to some embodiments, an embodiment of the present disclosure provides a method for fabricating a semiconductor structure, including the following steps:

providing a substrate is, and forming a bitline contact structure and a bitline sequentially on the substrate; the bitline includes a connection layer connected with the bitline contact structure;

etching back the bitline contact structure and the sidewalls of the connection layer; and forming a first silicide layer covering the sidewalls of the bitline contact structure, and a second silicide layer covering the sidewalls of the connection layer.

According to some embodiments, the bitline further includes a conductive layer on a side of the connection layer facing away from the substrate; wherein the first silicide layer and the second silicide layer are on the substrate. The orthographic projection of is at least within the range of the orthographic projection of the conductive layer on the substrate.

According to some embodiments, the thickness of the first silicide layer is greater than the thickness of the second silicide layer.

According to some embodiments, the etch-back thickness of the bitline contact structure and the sidewalls of the connection layer ranges from 2 nm to 10 nm.

According to some embodiments, the height of the connection layer is 35%~65% of the height of the bitline.

According to some embodiments, forming a first silicide layer covering the sidewalls of the bitline contact structure and a second silicide layer covering the sidewalls of the connection layer includes the following steps.

A metal material layer is deposited on the sidewalls after the bitline contact structure and the connection layer are etched back.

The resulting structure is annealed to obtain the first silicide layer and the second silicide layer.

In some embodiments, after annealing the obtained structure to obtain the first silicide layer and the second silicide layer, the preparation method further includes: removing the remaining metal material layer.

According to some embodiments, the annealing temperature for annealing the obtained structure is 300° C. to 700° C.

According to some embodiments, the step of depositing a metal material layer on the sidewalls of the bitline contact structure and the connection layer after being etched back includes: on the sidewalls of the bitline contact structure after being etched back depositing a first metal material layer; depositing a second metal material layer on the sidewalls after the connection layer is etched back; wherein, the first metal material layer or the second metal material layer includes a single-layer metal material layer or a stack of layers of metallic materials.

According to some embodiments, after the forming of the first silicide layer covering the sidewalls of the bitline contact structure and the second silicide layer covering the sidewalls of the connection layer, the preparation method further includes: an isolation structure formed on the sidewalls of the first silicide layer; and spacers formed on the sidewalls of the second silicide layer and the sidewalls of the bitline are not covered by the second silicide layer.

According to some embodiments, after forming spacers on the sidewalls of the second silicide layer and the sidewalls of the bitline not covered by the second silicide layer, the preparation method further includes: forming a storage node contact structure; the storage node contact structure is insulated from the first silicide layer by the isolation structure, and the storage node contact structure is insulated from the second silicide layer by the spacer.

According to some embodiments, on the other hand, some embodiments of the present disclosure provide a semiconductor structure, which is obtained by using the manufacturing method described in some of the above embodiments. The semiconductor structure includes: a substrate, a bitline contact structure, a first silicide layer, a bitline and a second silicide layer. The substrate has bitline contact holes. The bitline contact structure is disposed in the bitline contact hole. The first silicide layer is disposed on the sidewalls of the bitline contact structure. The bitline includes a connection layer connected to the bitline contact structure. The second silicide layer is disposed on the sidewalls of the connection layer.

According to some embodiments, the bitline further includes a conductive layer on a side of the connection layer facing away from the substrate; wherein the first silicide layer and the second silicide layer are on the substrate The orthographic projection of is at least within the range of the orthographic projection of the conductive layer on the substrate.

According to some embodiments, the orthographic projection of the second silicide layer on the substrate is within the orthographic projection of the conductive layer on the substrate, and the second silicide layer is on the substrate. There is a separation between the orthographic boundary on the conductive layer and the orthographic boundary of the conductive layer on the substrate.

According to some embodiments, the thickness of the first silicide layer is greater than the thickness of the second silicide layer.

According to some embodiments, the height of the connection layer is 35%~65% of the height of the bitline.

According to some embodiments, the semiconductor structure further includes an isolation structure and a spacer. The isolation structure is disposed on the sidewalls of the first silicide layer. The sidewalls spacers are disposed on the sidewalls of the second silicide layer and the sidewalls of the bitline not covered by the second silicide layer.

According to some embodiments, the semiconductor structure further includes: a storage node contact structure; the storage node contact structure is insulated from the first silicide layer by the isolation structure, and the storage node contact structure is passed through the spacer is insulated from the second silicide layer.

The embodiments of the present disclosure at least have the following advantages:

In the embodiment of the present disclosure, by etching back the sidewalls of the bitline contact structure and the sidewalls of the connection layer in the bitline, a first silicide layer can be formed on the sidewalls of the bitline contact structure after the thickness reduction, a second silicide layer is formed on the sidewalls of the bitline connection layer after the thickness. In this way, the first silicide layer and the second silicide layer can be used to effectively reduce the contact resistance between the bitline contact structure and the bitline under the condition that the design dimensions of the bitline and the bitline contact hole are kept unchanged. Thereby, the electrical properties of the semiconductor structure are improved, so as to improve the reliability and yield of the semiconductor structure.

In addition, in the embodiment of the present disclosure, by setting the thicknesses of the first silicide layer and the second silicide layer, for example, setting the orthographic projection of the first silicide layer and the second silicide layer on the substrate at least in the bitline is conductive. The orthographic projection of the layer on the substrate, in particular, the orthographic projection of the second silicide layer on the substrate is located within the orthographic projection of the conductive layer on the substrate, and the orthographic projection of the second silicide layer on the substrate The boundary is spaced from the orthographic boundary of the conductive layer on the substrate. This can not only reduce the contact resistance between the bitline contact structure and the bitline, but also increase the bitline contact structure and the bitline and adjacent conductive structures under the condition that the design size of the bitline and the bitline contact hole is kept unchanged. The distance between them can effectively reduce the parasitic capacitance. Therefore, the electrical properties of the semiconductor structure can be further improved, so as to further improve the reliability and yield of the semiconductor structure.

The details of one or more embodiments of the disclosure are set forth in the accompanying drawings and the description below. Other features, objects, and advantages of the present disclosure will become apparent from the description, drawings, and claims.

BRIEF DESCRIPTION OF THE DRAWINGS

In order to illustrate the technical solutions of the embodiments of the present disclosure more clearly, the following briefly introduces the accompanying drawings used in the description of the embodiments. Obviously, the accompanying drawings in the following description are only some embodiments of the present disclosure. For those of ordinary skill in the art, the drawings of other embodiments can also be obtained according to these drawings without creative effort.

FIG. 10 is also a schematic structural diagram of a semiconductor according to an embodiment.

DETAILED DESCRIPTION OF THE PREFERRED EMBODIMENTS

Figure 1:
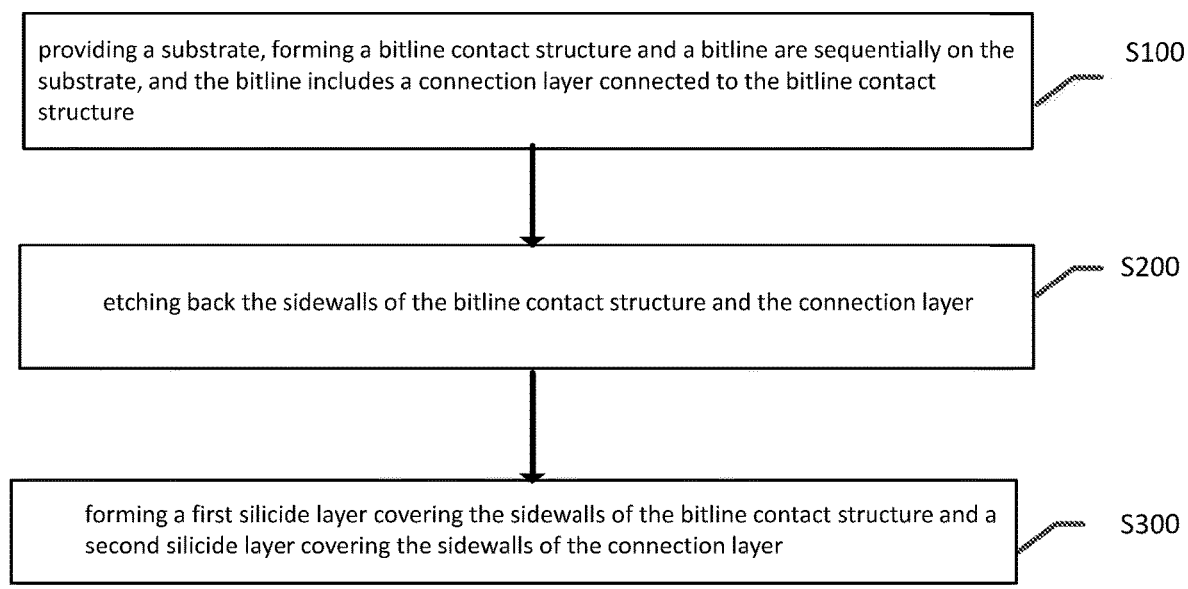
FIG. 1 is a schematic flowchart of a method for fabricating a semiconductor structure according to an embodiment.

To facilitate understanding of the present disclosure, the present disclosure will be described more fully hereinafter with reference to the related drawings. Embodiments of the present disclosure are presented in the accompanying drawings. However, the present disclosure may be embodied in many different forms and is not limited to the embodiments described herein. Rather, these embodiments are provided so that this disclosure will be thorough and complete.

Unless otherwise defined, all technical and scientific terms used herein have the same meaning as commonly understood by one of ordinary skill in the art to which this disclosure belongs. The terms used herein in the specification of the present disclosure are for the purpose of describing specific embodiments only and are not intended to limit the present disclosure.

It will be understood that when an element or layer is referred to as being "on," "adjacent to," "connected to," or "coupled to" other elements or layers, it can be directly on the other elements or layers may be on, adjacent to, connected or coupled to other elements or layers, or intervening elements or layers may be present. In contrast, when an element is referred to as being "directly on," "directly adjacent to," "directly connected to," or "directly coupled to" other elements or layers, there are no intervening elements or layers present.

Spatial relational terms such as "under", "below", "below", "under", "above", "above", etc., in This may be used to describe the relationship of one element or feature to other elements or features shown in the figures. It should be understood that in addition to the orientation shown in the figures, the spatially relative terms encompass different orientations of the device in use and operation. For example, if the device in the figures is turned over, elements or features described as "below" or "beneath" or "under" other elements or features would then be oriented "above" the other elements or features. Thus, the exemplary terms "below" and "under" can encompass both an orientation of above and below. In addition, the device may also be otherwise oriented (e.g., rotated 90 degrees or at other orientations) and the spatial descriptors used herein interpreted accordingly.

As used herein, the singular forms "a," "an," and "the/the" can include the plural forms as well, unless the context clearly dictates otherwise. It should also be understood that the terms "comprising/comprising" or "having" etc. designate the presence of stated features, integers, steps, operations, components, parts or combinations thereof, but do not preclude the presence or addition of one or more Possibilities of other features, integers, steps, operations, components, parts or combinations thereof. Also, in this specification, the term "and/or" includes any and all combinations of the associated listed items.

Embodiments of the invention are described herein with reference to cross-sectional illustrations that are schematic illustrations of idealized embodiments (and intermediate structures) of the present disclosure, such that variations in the shapes shown may be contemplated due, for example, to manufacturing techniques and/or tolerances. Thus, embodiments of the present disclosure should not be limited to the particular shapes of the regions shown herein, but include shape deviations due, for example, to manufacturing techniques. The regions shown in the figures are schematic in nature and their shapes do not represent the actual shape of a region of a device and do not limit the scope of the present disclosure.

Referring to FIG. 1, some embodiments of the present disclosure provide a method for fabricating a semiconductor structure, including the following steps.

S100, providing a substrate, and forming a bitline contact structure and a bitline are sequentially on the substrate, and the bitline includes a connection layer connected to the bitline contact structure;

S200, etching back the sidewalls of the bitline contact structure and the connection layer; and S300, forming a first silicide layer covering the sidewalls of the bitline contact structure and a second silicide layer covering the sidewalls of the connection layer.

In the embodiment of the present disclosure, by etching back the sidewalls of the bitline contact structure and the sidewalls of the connection layer in the bitline, a first silicide layer can be formed on the sidewalls of the bitline contact structure after the thickness reduction, a second silicide layer is formed on the sidewalls of the bitline connection layer after the thickness. In this way, the first silicide layer and the second silicide layer can be used to effectively reduce the contact resistance between the bitline contact structure and the bitline while ensuring that the designed dimensions of the bitline and the bitline contact structure remain unchanged. Thereby, the electrical properties of the semiconductor structure are improved, so as to improve the reliability and yield of the semiconductor structure.

Figure 2:
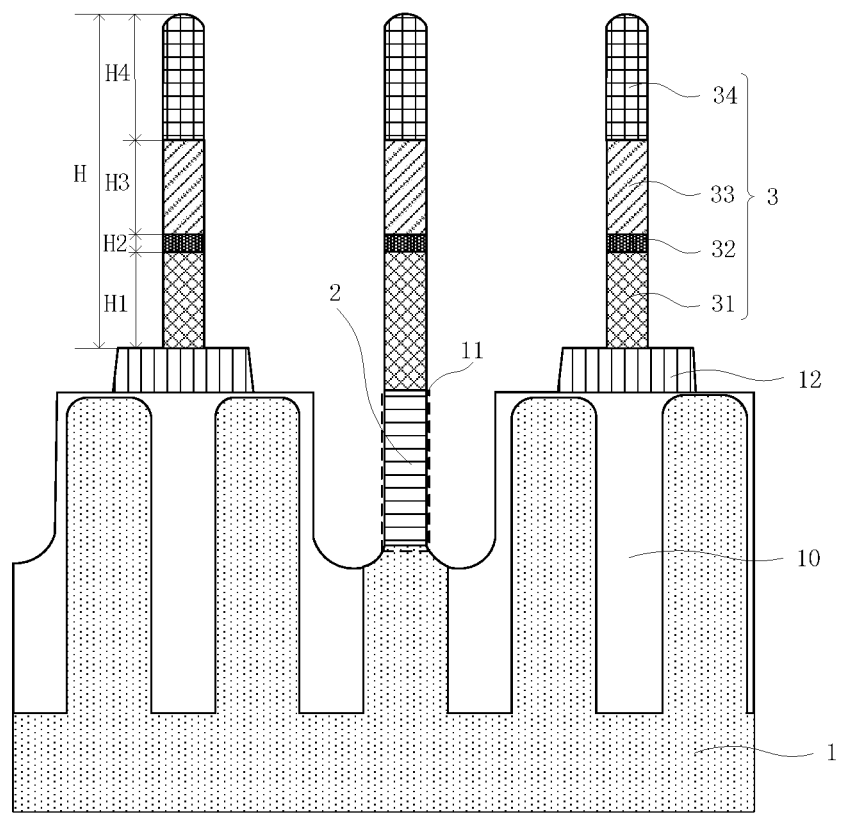
FIG. 2 is a schematic cross-sectional view of a structure obtained after forming a bitline contact structure and a bitline according to an embodiment.

In step S100, referring to S100 in FIG. 1 and FIG. 2, a substrate 1 is provided, and a bitline contact structure 2 and a bitline 3 are sequentially formed on the substrate 1. The bitline 3 includes a connection layer 31 connected to the bitline contact structure 2.

In some embodiments, the substrate 1 may include semiconductor materials, insulating materials, conductor materials, or any combination thereof. The substrate 1 may have a single-layer structure or a multi-layer structure. For example, the substrate 1 may be, for example, a silicon (Si) substrate, a silicon germanium (SiGe) substrate, a silicon germanium carbon (SiGeC) substrate, a silicon carbide (SiC) substrate, a gallium arsenide (GaAs) substrate, an arsenic Indium phosphide (InAs) substrates, indium phosphide (InP) substrates or other III/V semiconductor substrates or II/VI semiconductor substrates. Alternatively, also for example, the substrate 1 may be a layered substrate comprising eg Si/SiGe, Si/SiC, silicon on insulator (SOI) or silicon germanium on insulator.

In one example, the substrate 1 includes, but is not limited to, a silicon substrate or a silicon-based substrate. The substrate 1 has a shallow trench isolation structure 10, and the shallow trench isolation structure 10 isolates an active region within the substrate 1. Optionally, the shallow trench isolation structure 10 is a silicon oxide ($SiO_2$) isolation structure. The shallow trench isolation structure 10 can isolate a plurality of active regions arranged in an array in the substrate 1.

Continue to refer to FIG. 2 for some embodiments, a bitline contact hole (BLC for short) 11 is provided in the active area on the substrate 1, and the bitline contact structure 2 is filled in the corresponding bitline inside the line contact hole 11. The bitline contact hole 11 may be a round hole, a square hole or a special-shaped hole. The shape and size of the bitline contact hole 11 are not limited in the embodiment of the present disclosure.

In some embodiments, the connection layer 31 of the bitline 3 may be formed by using doped polysilicon, silicon germanium and other materials with conductive functions. The material of the bitline contact structure 2 may be the same as or different from the material of the connection layer 31 in the bitline 3. Alternatively, the material of the bitline contact structure 2 can be the same as the material of the connection layer 31 in the bitline 3, but the doping concentration of the two can be different, the etching rates of the two can be different when they are formed, and the sidewalls of the two can be etched back. The etching rate can also be different at different times, and the specific setting can be selected according to actual needs. This embodiment of the present disclosure does not limit this, and also does not limit the shapes of the bitline contact structure 2 and the connection layer 31 after being etched.

In an example, please continue to refer to FIG. 2, the part of the bitline 3 other than the connection layer 31 connecting with the bitline contact structure 2 is insulated from the substrate 1 by the dielectric layer 12. Optionally, the dielectric layer 12 may be an insulating layer such as a silicon nitride layer, a silicon oxide layer, or a silicon oxynitride layer. The thickness of the dielectric layer 12 can be selected and set according to actual requirements.

In one example, the connection layer 31 in the bitline 3 and the bitline contact structure 2 are both doped polysilicon layers, and the doping concentration of the two can be the same.

It can be understood that, in some embodiments, please continue to refer to FIG. 2, the bitline 3 further includes a first barrier layer 32, a conductive layer 33 and a top isolation layer 34 which are sequentially arranged on one side of the connection layer 31 along the direction away from the substrate 1.

Optionally, the first barrier layer 32 includes, but is not limited to, a titanium nitride layer. For example, the first barrier layer 32 may also be a titanium layer.

Optionally, the conductive layer 33 includes, but is not limited to, a tungsten metal layer. For example, the conductive layer 33 can also be a copper metal layer or a gold metal layer.

Optionally, the top isolation layer 34 includes, but is not limited to, a silicon nitride layer. For example, the top isolation layer 34 may also be a silicon oxynitride layer.

The above-mentioned first barrier layer 32, conductive layer 33 and top isolation layer 34 can be obtained by patterning each material layer through a patterning process after depositing the corresponding material layer. Optionally, the top isolation layer 34 can be formed by using a hard mask material to be used as a hard mask during the formation of the conductive layer 33, the first barrier layer 32 and the connection layer 31.

Here, the deposition process includes but is not limited to low pressure chemical vapor deposition (LPCVD), high density plasma chemical vapor deposition (HDPCVD), plasma enhanced chemical vapor deposition (PECVD) or atomic layer chemical vapor deposition (ALCVD) and other processes. The patterning process includes but is not limited to wet etching or dry etching, wherein the dry etching at least includes reactive ion etching (RIE), inductively coupled plasma etching (ICP) or high concentration plasma etching (HDP)) any of them.

In some embodiments, the height of the connection layer 31 is 35% 65% of the height of the bitline 3. For example, the height of the connection layer 31 is 35%, 40%, 45%, 50%, 55%, 60% or 65% of the height of the bitline 3.

Here, please refer to FIG. 2, in the example in which the bitline 3 adopts the aforementioned structure, the height H of the bitline 3 refers to the sum of the heights of the connection layer 31, the first barrier layer 32, the conductive layer 33 and the top isolation layer 34 That is, H=H1+H2+H3+H4, wherein H1 is the height of the connecting layer 31, H2 is the height of the first barrier layer 32, H3 is the height of the conductive layer 33, and H4 is the height of the top isolation layer 34.

Figure 3:
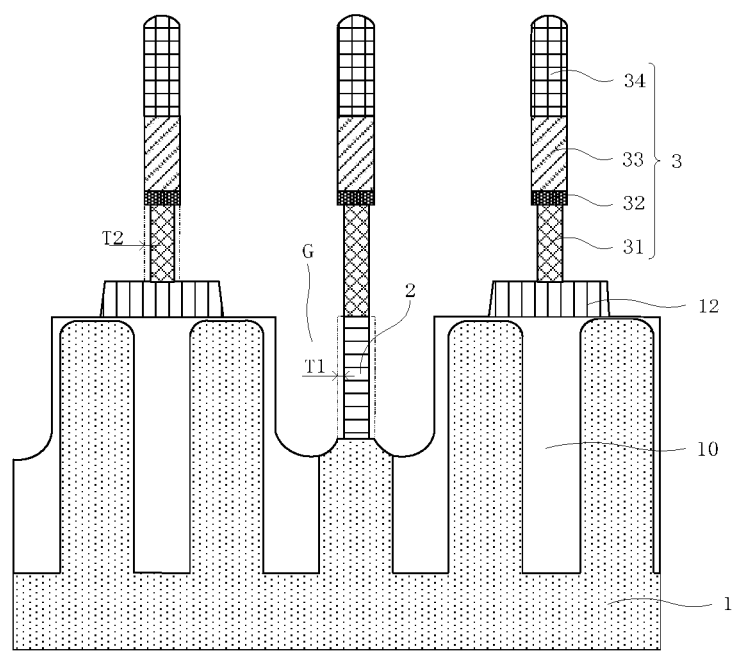
FIG. 3 is a schematic cross-sectional view of the structure obtained after the bitline contact structure and the sidewalls of the connection layer are etched back according to an embodiment.

In step S200, referring to S200 in FIG. 1 and FIG. 3, the sidewalls of the bitline contact structure 2 and the connection layer 31 are etched back.

Here, according to the formation materials of the bitline contact structure 2 and the connection layer 31, an etching process can be reasonably selected for etching back. The etching process includes but is not limited to wet etching or dry etching, wherein the dry etching may at least include reactive ion etching (RIE), inductively coupled plasma etching (ICP) or high concentration plasma etching (HDP) either.

In addition, the etch-back thicknesses of the sidewalls of the bitline contact structure 2 and the connection layer 31 can be selected according to actual requirements. In addition, the etched back thicknesses of the sidewalls of the bitline contact structure 2 and the connection layer 31 may be the same or different.

Optionally, the etch-back thickness of the sidewalls of the bitline contact structure 2 and the connection layer 31 ranges from 2 nm to 10 nm. For example, referring to FIG. 3, the etched back thickness T1 of the sidewalls of the bitline contact structure 2 can be 2 nm, 3 nm, 4 nm, 5 nm, 6 nm, 7 nm, 8 nm, 9 nm or 10 nm. For example, the etch-back thickness T2 of the sidewalls of the connection layer 31 is 2 nm, 3 nm, 4 nm, 5 nm, 6 nm, 7 nm, 8 nm, 9 nm or 10 nm.

In addition, please understand with reference to FIG. 3, the bitline contact structure 2 is formed in the bitline contact hole 11, and the etching of the sidewalls of the bitline contact structure 2 can be performed by the trench G formed on the side thereof, for example, the trench G is used to fill the isolation material to form the isolation structure corresponding to the bitline contact structure 2.

Figure 4:
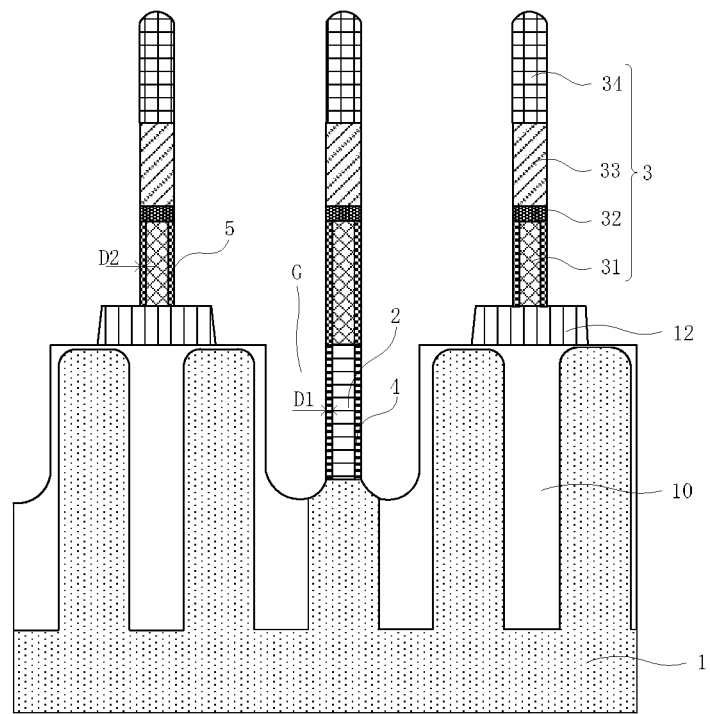
FIG. 4 is a schematic cross-sectional view of a structure obtained after forming a first silicide layer and a second silicide layer according to an embodiment.

In step S300, referring to FIG. 1 and FIG. 4, a first silicide layer 4 covering the sidewalls of the bitline contact structure 2 and a second silicide layer 5 covering the sidewalls of the connection layer 31 are formed.

The first silicide layer 4 and the second silicide layer 5 may be the same silicide layer, or may be different silicide layers. Correspondingly, the first silicide layer 4 and the second silicide layer 5 may be formed simultaneously or in steps. This embodiment of the present disclosure does not limit this.

Figure 5:
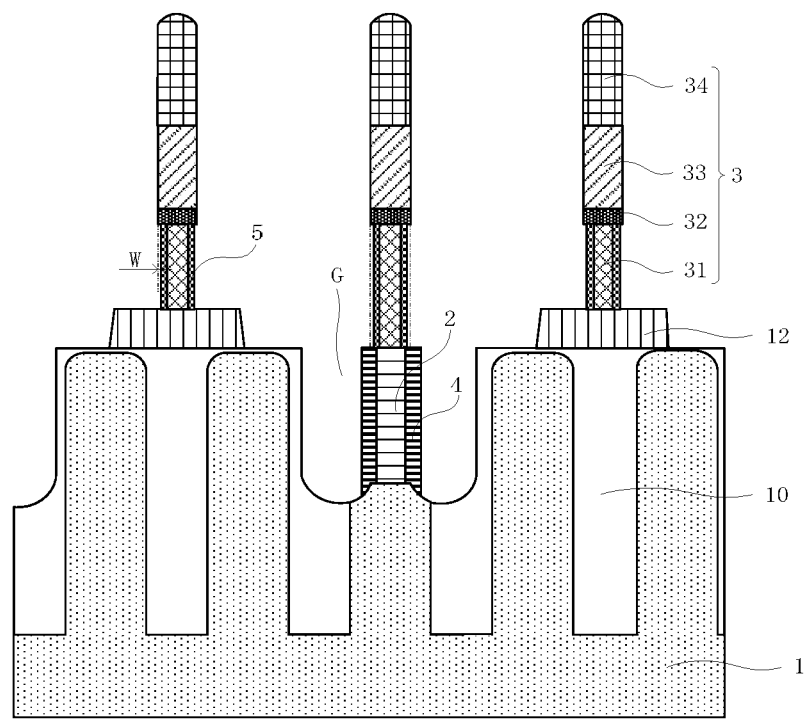
FIG. 5 is a schematic cross-sectional view of a structure obtained after forming a first silicide layer and a second silicide layer according to another embodiment.

In some embodiments, referring to FIG. 4 and FIG. 5, the bitline 3 further includes a conductive layer 33 located on the top side of the connection layer 31 away from the substrate 1. The first silicide layer 4 is formed on the sidewalls after the bitline contact structure 2 is etched back, and the second silicide layer 5 is formed on the sidewalls after the connection layer 31 is etched back. The first silicide layer 4 and the orthographic projection of the second silicide layer 5 on the substrate 1 is at least within the range of the orthographic projection of the conductive layer 33 on the substrate 1.

Here, the orthographic projections of the first silicide layer 4 and the second silicide layer 5 on the substrate 1 are at least within the range of the orthographic projection of the conductive layer 33 on the substrate 1, including: the first silicide layer 4 and the first silicide layer 5, each of the silicide layers 5 includes a portion located directly below the bottom of the conductive layer 33 (i.e., under), or the first silicide layer 4 and/or the second silicide layer 5 includes a portion located directly under the conductive layer 33 (i.e., vertically). In addition to the part directly under), it also includes the part whose orthographic projection is located outside the orthographic projection of the conductive layer 33 on the substrate 1.

In one example, as shown in FIG. 5, the orthographic projection of the second silicide layer 5 on the substrate 1 is located within the orthographic projection of the conductive layer 33 on the substrate 1. There is a separation gap W between the orthographic projection of the second silicide layer 5 on the substrate 1 and the orthographic projection of the conductive layer 33 on the substrate 1.

From the above, in conjunction with FIG. 4 and FIG. 5, the thickness D1 of the first silicide layer 4 and the thickness D2 of the second silicide layer 5 may be the same or different.

In one example, referring to FIG. 4, the thickness D1 of the first silicide layer 4 is equal to the thickness D2 of the second silicide layer 5.

In one example, referring to FIG. 5, the thickness D1 of the first silicide layer 4 is greater than the thickness D2 of the second silicide layer 5.

In the embodiment of the present disclosure, by setting the thicknesses of the first silicide layer 4 and the second silicide layer 5, it is possible to not only reduce the size of the bitline 3 while ensuring the design dimensions of the bitline 3 and the bitline contact hole 11 remain unchanged. The contact resistance with the bitline contact structure 2 can also increase the distance between the bitline contact structure 2 and the bitline 3 and adjacent conductive structures, so as to effectively reduce the parasitic capacitance. Therefore, the electrical properties of the semiconductor structure can be further improved, so as to further improve the reliability and yield of the semiconductor structure.

It is worth mentioning that the first silicide layer 4 and the second silicide layer 5 can be formed simultaneously or in steps. Also, the first silicide layer 4 and the second silicide layer 5 may be deposited directly or obtained by performing a metallization process on polysilicon. In addition, the first silicide layer 4 and the second silicide layer 5 may be a single-layer structure or a multi-layer structure, which may be selected and set according to actual requirements.

For examples for illustration, the following embodiments have the bitline contact structure 2 and the connection layer 31 as doped polysilicon layers and describe the preparation process of the first silicide layer 4 and the second silicide layer 5 in detail.

Figure 6:
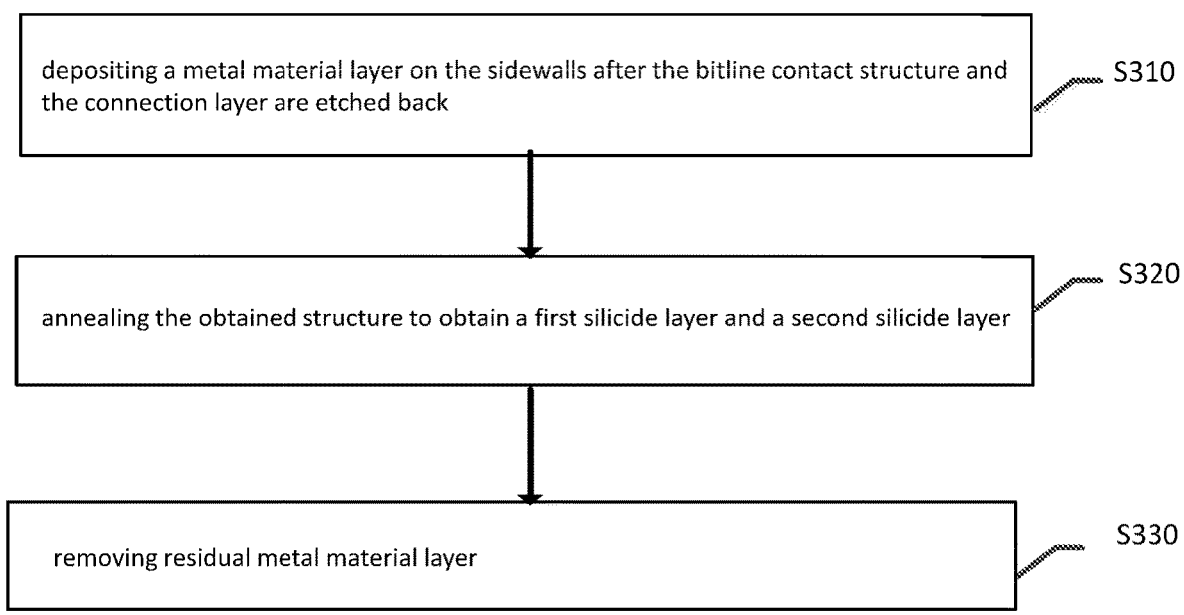
FIG. 6 is a schematic flowchart of step S300 according to an embodiment.

Referring to FIG. 6, in some embodiments, forming a first silicide layer covering the sidewalls of the bitline contact structure and a second silicide layer covering the sidewalls of the connection layer in step S300 includes the following steps.

S310, depositing a metal material layer on the sidewalls after the bitline contact structure and the connection layer are etched back.

S320, annealing the obtained structure to obtain a first silicide layer and a second silicide layer.

Please continue to refer to FIG. 6, in some embodiments, after annealing the obtained structure in step S320 to obtain the first silicide layer and the second silicide layer, the method further includes: S330, removing residual metal material layer.

Figure 7:
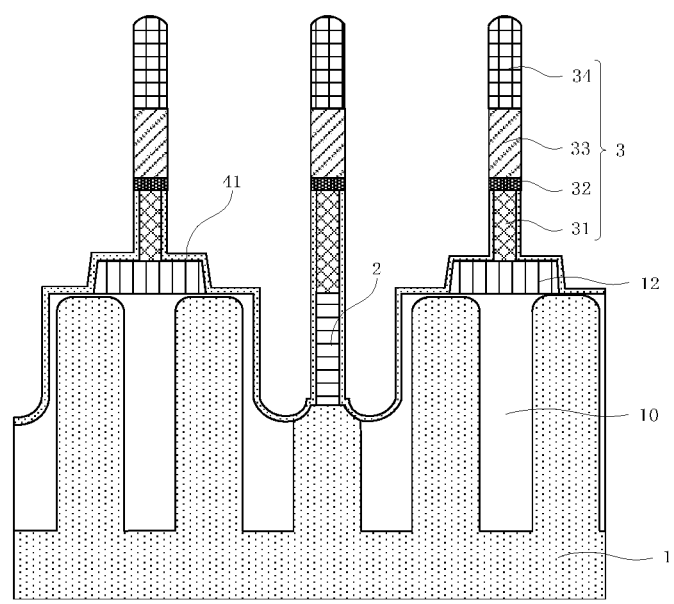
FIG. 7 is a schematic cross-sectional view of a structure obtained after forming a metal material layer according to an embodiment.

In step S310, referring to S310 in FIG. 6 and FIG. 7, a metal material layer 41 is deposited on the sidewalls of the bitline contact structure 2 and the connection layer 31 after being etched back.

Here, the metal material layer 41 is, for example, a metal element layer or a metal compound layer. Alternatively, the metal material layer 41 may also be a single material layer or multiple material layers. Optionally, the metal material layer 41 is a tantalum (Ta) metal layer, a stack of tantalum (Ta) and tantalum titanium (TaTi), a tungsten nitride (WN) material layer, a cobalt (Co) metal layer, or the like.

Figure 8:
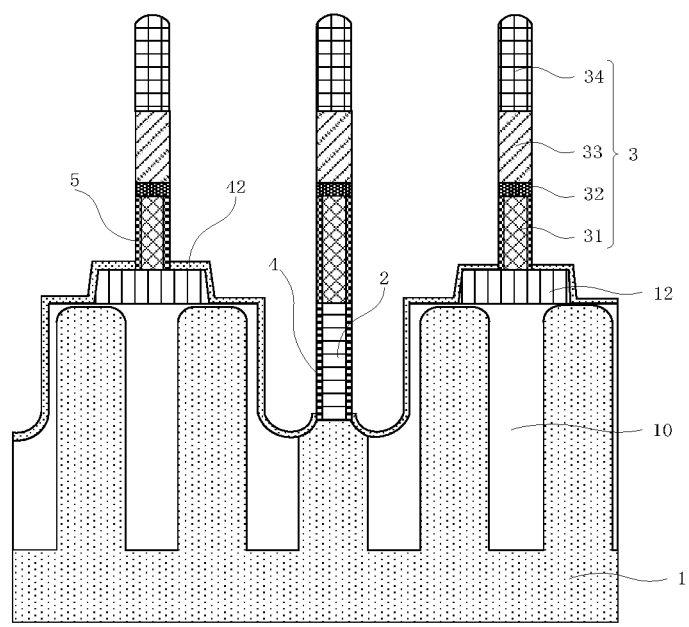
FIG. 8 is a schematic cross-sectional view of a structure obtained after annealing the metal material layer according to an embodiment.

In step S320, referring to S320 in FIG. 6 and FIG. 8, the obtained structure shown in FIG. 7 is annealed to obtain the first silicide layer 4 and the second silicide layer 5.

Here, it can be understood that after the structure shown in FIG. 7 is annealed, the portions of the metal material layer 41 located on the sidewalls of the bitline contact structure 2 and the sidewalls of the connection layer 31 can be correspondingly converted into silicide layers.

Optionally, the annealing temperature for annealing the obtained structure is 300° C. to 700° C. For example, the annealing temperature may be 300° C., 400° C., 500° C., 600° C. or 700° C.

In step S330, referring to S330 in FIG. 6 and FIG. 8, the remaining metal material layer 42 is removed.

Here, the residual metal material layer 42 means that the metal material layer 41 is transformed to form other parts than the first silicide layer 4 and the second silicide layer 5.

It is worth mentioning that, in some embodiments, the first silicide layer 4 and the second silicide layer 5 may be formed of different materials and formed in steps. Based on this, in step S310, depositing the metal material layer 41 on the sidewalls of the bitline contact structure 2 and the connection layer 31 after being etched back may include: depositing the first metal material layer 41 on the sidewalls of the bitline contact structure 2 after being etched back. A metal material layer; a second metal material layer is deposited on the sidewalls after the connection layer 31 is etched back; wherein, the first metal material layer or the second metal material layer includes: a single-layer metal material layer or a multi-layer metal material layer of the stack. Correspondingly, after the first metal material layer and the second metal material layer are formed, steps S320 and S330 in the foregoing embodiments may be referred to prepare the first silicide layer 4 and the second silicide layer 5. This embodiment of the present disclosure will not describe this in detail.

Figure 9:
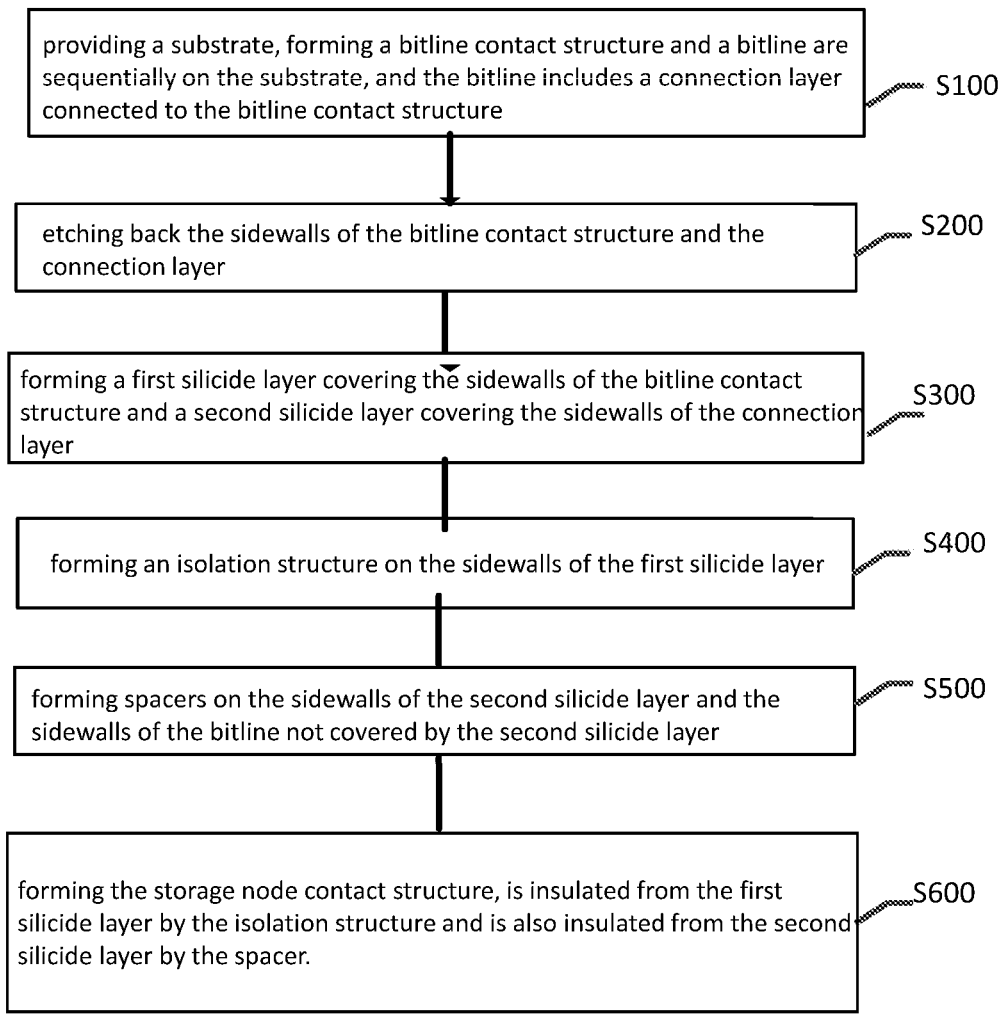
FIG. 9 is a schematic flowchart of another method for fabricating a semiconductor structure according to an embodiment.

Referring to FIG. 9, in some embodiments, after forming the first silicide layer 4 covering the sidewalls of the bitline contact structure 2 and the second silicide layer 5 covering the sidewalls of the connection layer 31 in step S300, the method also includes the following steps.

S400, forming an isolation structure on the sidewalls of the first silicide layer.

S500, forming spacers on the sidewalls of the second silicide layer and the sidewalls of the bitline not covered by the second silicide layer.

Here, it should be understood that the execution of steps S400 and S500 is not strictly limited in sequence, and these steps may be executed simultaneously or in other sequences. Moreover, in the embodiment of the present disclosure, at least a part of the steps of the preparation method may include multiple sub-steps or multiple stages, and these sub-steps or stages are not necessarily executed and completed at the same moment, but may be performed at different moments. The execution order of these sub-steps or phases is not necessarily performed sequentially, but may be performed alternately or alternately with other steps or at least a part of the sub-steps or phases of other steps.

In step S400, referring to FIG. 9, isolation structures 6 are formed on the sidewalls of the first silicide layer 4.

The above-mentioned isolation structure 6 can be formed by using a dielectric material with a relatively high dielectric constant, and the isolation structure 6 is, for example, a single-layer dielectric layer, or a stack of multiple dielectric layers. The isolation structure 6 may be formed by filling the trench G in the foregoing example. The isolation structure 6 is used to insulate the corresponding bitline contact structure 2, and the isolation structure 6 covers the sidewalls of the first silicide layer 4; that is to say, the first silicide layer 4 can be an equivalent bitline contact structure. A component to ensure that the size of the equivalent bitline contact structure can meet the design requirements. (The equivalent bitline contact structure may be composed of the bitline contact structure 2 and the first silicide layer 4 together).

In step S500, referring to FIG. 9, spacers 7 are formed on the sidewalls of the second silicide layer 5 and the sidewalls of the bitline 3 not covered by the second silicide layer 5.

The spacer 7 may be formed of a dielectric material with a lower dielectric constant, for example, the spacer 7 is a single-layer dielectric layer, or a stack of multiple dielectric layers. The spacers 7 are used to insulate the corresponding bitline 3, and the spacers 7 cover the second silicide layer 5 and the side walls of the bitline 3; that is to say, the second silicide layers 5 can be equivalent to the bitline. A component to ensure that the size of the equivalent bitline can meet the design requirements. In addition, the thickness of the side wall 7 can be selected and set according to actual needs.

Optionally, the isolation structure 6 and the sidewalls spacers 7 respectively adopt a structure formed by stacking a first silicon nitride layer, a silicon oxide layer and a second silicon nitride layer. The isolation structure 6 and the sidewalls 7 can be formed simultaneously.

In the embodiment of the present disclosure, the formation of the first silicide layer 4 and the second silicide layer 5 is arranged before the formation of the isolation structure 6 corresponding to the bitline contact structure 2 and the sidewalls spacer 7 corresponding to the bitline 3, which is beneficial to simplify The preparation process of the semiconductor structure reduces the difficulty of preparing the semiconductor structure, thereby improving the production efficiency and yield of the semiconductor structure.

Figure 10:
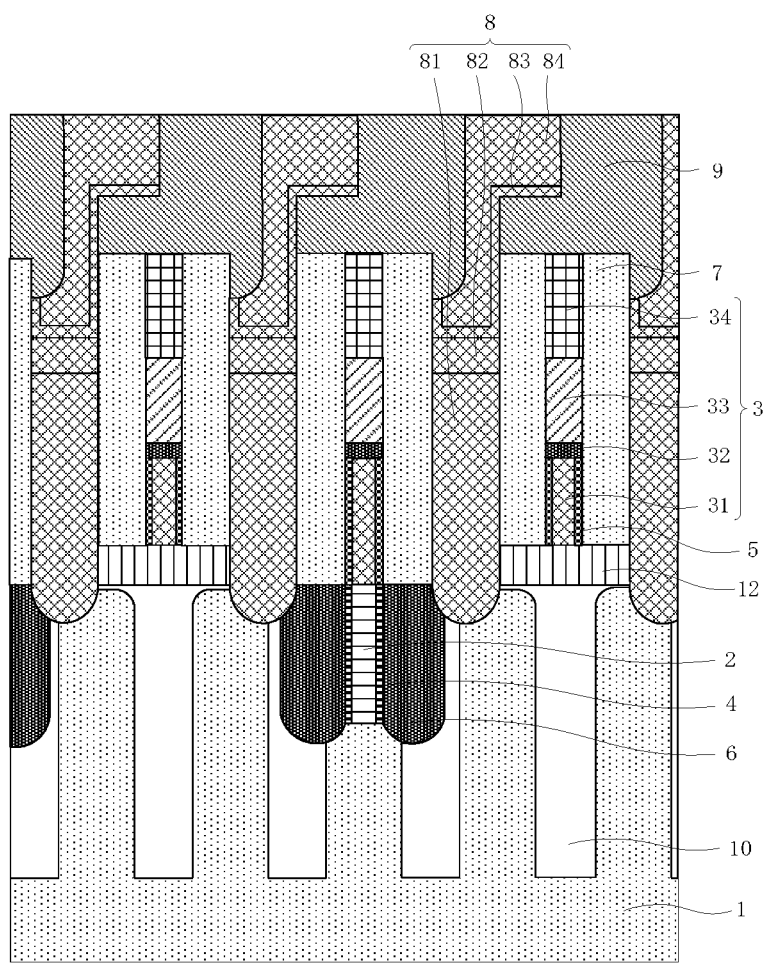
FIG. 10 is a schematic cross-sectional view of a structure obtained after forming a storage node contact structure provided in an embodiment.

Please continue to refer to FIG. 9 and FIG. 10, in some embodiments, the method further includes: S600, forming the storage node contact structure 8. The storage node contact structure 8 is insulated from the first silicide layer 4 by the isolation structure 6, and the storage node contact structure 8 is insulated from the second silicide layer 5 by the spacer 7.

It can be understood that the storage node contact structure 8 is usually formed in the corresponding storage node contact hole. Illustratively, storage node contact holes may be formed on the resulting structure after forming the isolation structures 6 and the spacers 7 to form the storage node contact structures 8 within the storage node contact holes and between adjacent storage node contact structures 8. The insulating layer 9 is used to effectively insulate the adjacent storage node contact structures 8 by the insulating layer 9.

Optionally, the storage node contact structure 8 includes a first conductive layer 81, a conductive transition layer 82, a second barrier layer 83 and a second conductive layer 84 that are stacked in sequence along a direction away from the substrate 1. But it doesn't stop there. The first conductive layer 81 is, for example, a doped polysilicon layer. The conductive transition layer 82 is, for example, a cobalt silicide layer. The second barrier layer 83 is, for example, a titanium nitride layer. The second conductive layer 84 is, for example, a tungsten metal layer.

Optionally, the insulating layer 9 may be a silicon nitride layer, such as one or more silicon nitride layers. In addition, the insulating layer 9 may be formed at one time, or may be formed gradually in layers during the preparation of other layer structures. That is, the insulating layer 9 here refers to the entire insulating portion between adjacent storage node contact structures 8.

Some embodiments of the present disclosure provide a semiconductor structure, which is prepared by using the preparation methods described in some of the above embodiments. The technical advantages that can be achieved by the above preparation method are also possessed by the semiconductor structure, which will not be described in detail here.

Referring to FIG. 10, the semiconductor structure includes: a substrate 1, a bitline contact structure 2, a bitline 3, a first silicide layer 4 and a second silicide layer 5. The substrate 1 has bitline contact holes 11. The bitline contact structure 2 is disposed in the bitline contact hole 11. The first silicide layer 4 is disposed on the sidewalls of the bitline contact structure 2. The bitline 3 includes a connection layer 31 connected to the bitline contact structure 2. The second silicide layer 5 is disposed on the sidewalls of the connection layer 31.

Optionally, the substrate 1 is a silicon substrate or a silicon-based substrate, the substrate 1 has a shallow trench isolation structure 10, and the shallow trench isolation structure 10 isolates an active region in the substrate 1. The shallow trench isolation structure 10 is, for example, a silicon oxide ($SiO_2$) isolation structure. The shallow trench isolation structure 10 can isolate a plurality of active regions arranged in an array in the substrate 1. The bitline contact hole 11 is provided in the active region of the substrate 1.

Optionally, the bitline 3 includes a connection layer 31, a first barrier layer 32, a conductive layer 33 and a top isolation layer 34 which are arranged in sequence along a direction away from the substrate 1.

In some embodiments, the connection layer 31 of the bitline 3 may be a doped polysilicon layer or a silicon germanium layer with a conductive function. The bitline contact structure 2 may be the same as or different from the connection layer 31 in the bitline 3.

In one example, the connection layer 31 in the bitline 3 and the bitline contact structure 2 are both doped polysilicon layers, and the doping concentration of the two can be the same.

In one example, the first barrier layer 32 is a titanium nitride layer or a titanium layer.

In one example, the conductive layer 33 is a tungsten metal layer, a copper metal layer, or a gold metal layer.

In one example, the top isolation layer 34 is a silicon nitride layer or a silicon oxynitride layer.

In one example, the part of the bitline 3 other than the connection layer 31 connecting with the bitline contact structure 2 is insulated from the substrate 1 by the dielectric layer 12. Optionally, the dielectric layer 12 may be an insulating layer such as a silicon nitride layer, a silicon oxide layer, or a silicon oxynitride layer. The thickness of the dielectric layer 12 can be selected and set according to actual requirements.

In some embodiments, the height of the connection layer 31 is 35%~65% of the height of the bitline 3. For example, the height of the connection layer 31 is 35%, 40%, 45%, 50%, 55%, 60% or 65% of the height of the bitline 3.

In some embodiments, the first silicide layer 4 and the second silicide layer 5 may be the same silicide layer, or may be different silicide layers.

Optionally, the orthographic projections of the first silicide layer 4 and the second silicide layer 5 on the substrate 1 are at least within the range of the orthographic projection of the conductive layer 33 on the substrate 1.

Here, the orthographic projections of the first silicide layer 4 and the second silicide layer 5 on the substrate 1 are at least within the range of the orthographic projection of the conductive layer 33 on the substrate 1, including: the first silicide layer 4 and the first silicide layer 5, each of the silicide layers 5 includes a portion located directly under the conductive layer 33 (i.e., vertically under), or the first silicide layer 4 and/or the second silicide layer 5 includes a portion located directly under the conductive layer 33 (i.e., vertically below). In addition to the part directly under, it also includes the part whose orthographic projection is located outside the orthographic projection of the conductive layer 33 on the substrate 1.

In one example, the orthographic projection of the second silicide layer 5 on the substrate 1 is located within the orthographic projection of the conductive layer 33 on the substrate 1, and the orthographic projection boundary of the second silicide layer 5 on the substrate 1 is the same as the conductive layer 33 has a space between the orthographic boundaries on the substrate 1.

From the above, the thickness of the first silicide layer 4 and the thickness of the second silicide layer 5 can be the same or different.

In one example, the thickness of the first silicide layer 4 is equal to the thickness of the second silicide layer 5.

In one example, the thickness of the first silicide layer 4 is greater than the thickness of the second silicide layer 5.

In the embodiment of the present disclosure, by setting the thicknesses of the first silicide layer 4 and the second silicide layer 5, it is possible to not only reduce the size of the bitline 3 while ensuring the design dimensions of the bitline 3 and the bitline contact hole 11 remain unchanged. The contact resistance with the bitline contact structure 2 can also increase the distance between the bitline contact structure 2 and the bitline 3 and adjacent conductive structures, so as to effectively reduce the parasitic capacitance. Therefore, the electrical properties of the semiconductor structure can be further improved, so as to further improve the reliability and yield of the semiconductor structure.

Please continue to refer to FIG. 10, in some embodiments, the semiconductor structure further includes: an isolation structure 6 and a spacer 7. The isolation structure 6 is disposed on the sidewalls of the first silicide layer 4. The sidewalls spacers 7 are disposed on the sidewalls of the second silicide layer 5 and the sidewalls of the bitline 3 not covered by the second silicide layer 5.

Optionally, the isolation structure 6 is formed of a dielectric material with a higher dielectric constant, such as a single-layer dielectric layer, or a stack of multiple dielectric layers. The isolation structure 6 is used to insulate the corresponding bitline contact structure 2, and the isolation structure 6 is arranged on the sidewalls of the first silicide layer 4; that is to say, the first silicide layer 4 can be an equivalent bitline contact structure. A component to ensure that the size of the equivalent bitline contact structure can meet the design requirements. (The equivalent bitline contact structure may be composed of the bitline contact structure 2 and the first silicide layer 4 together).

Optionally, the sidewalls 7 may be formed of a dielectric material with a lower dielectric constant, such as a single-layer dielectric layer, or a stack of multiple dielectric layers. The spacers 7 are used to insulate the corresponding bitline 3, and the spacers 7 cover the second silicide layer 5 and the side walls of the bitline 3; that is to say, the second silicide layers 5 can be equivalent to the bitlines. A component to ensure that the size of the equivalent bitline can meet the design requirements. (The equivalent bitline may include the bitline 3 and the second silicide layer 5 together). In addition, the thickness of the side wall 7 can be selected and set according to actual needs.

In one example, the isolation structure 6 and the spacer 7 are respectively formed by stacking a first silicon nitride layer, a silicon oxide layer and a second silicon nitride layer.

Please continue to refer to FIG. 10, in some embodiments, the semiconductor structure further includes: a storage node contact structure 8. The storage node contact structure 8 is insulated from the first silicide layer 4 by the isolation structure 6, and the storage node contact structure 8 is insulated from the second silicide layer 5 by the spacer 7.

Optionally, the storage node contact structure 8 includes a first conductive layer 81, a conductive transition layer 82, a second barrier layer 83 and a second conductive layer 84 that are stacked in sequence along a direction away from the substrate 1. But it doesn't stop there. The first conductive layer 81 is, for example, a doped polysilicon layer. The conductive transition layer 82 is, for example, a cobalt silicide layer. The second barrier layer 83 is, for example, a titanium nitride layer. The second conductive layer 84 is, for example, a tungsten metal layer.

Optionally, an insulating layer 9 is further provided between adjacent storage node contact structures 8. The insulating layer 9 may be a silicon nitride layer, for example, one or more layers of silicon nitride layers. Here, the insulating layer 9 refers to the entire insulating portion between adjacent storage node contact structures 8.

In conclusion, the semiconductor structure and the manufacturing method thereof provided by the embodiments of the present disclosure can not only reduce the distance between the bitline contact structure 2 and the bitline 3 under the condition that the design dimensions of the bitline 3 and the bitline contact hole 11 are kept unchanged. The contact resistance can also increase the distance between the bitline contact structure 2 and the bitline 3 and the adjacent conductive structures, so as to effectively reduce the parasitic capacitance. Therefore, the electrical properties of the semiconductor structure can be effectively improved, so as to further improve the reliability and yield of the semiconductor structure.

The technical features of the above-described embodiments can be combined arbitrarily. For the sake of brevity, all possible combinations of the technical features in the above-described embodiments are not described. However, as long as there is no contradiction between the combinations of these technical features, All should be regarded as the scope described in this specification.

The above-mentioned embodiments only represent several embodiments of the present disclosure, and the descriptions thereof are relatively specific and detailed, but should not be construed as limiting the scope of the patent application. It should be noted that, for those skilled in the art, without departing from the concept of the present disclosure, several modifications and improvements can be made, which all belong to the protection scope of the present disclosure. Accordingly, the scope of protection of the present disclosure should be determined by the appended claims.

The invention claimed is:

1. A semiconductor structure comprising:
   a substrate having bitline contact holes;
   a bitline contact structure disposed in each of the bitline contact holes;
   a first silicide layer disposed on sidewalls of the bitline contact structure;
   a bitline comprising a connection layer connected to the bitline contact structure; and
   a second silicide layer disposed on sidewalls of the connection layer.

2. The semiconductor structure of claim 1, wherein the bitline further comprises a conductive layer disposed on a side of the connection layer facing away from the substrate;

wherein each of an orthographic projection of the first silicide layer and an orthographic projection of the second silicide layer on the substrate is at least located within an orthographic projection of the conductive layer on the substrate.

3. The semiconductor structure of claim 2, wherein the orthographic projection of the second silicide layer on the substrate is located within the orthographic projection of the conductive layer on the substrate, and wherein a separation gap between the orthographic projection of the second silicide layer and the orthographic projection of the conductive layer on the substrate.

4. The semiconductor structure of claim 2, wherein a thickness of the first silicide layer is greater than a thickness of the second silicide layer.

5. The semiconductor structure of claim 1, wherein, a height of the connection layer is 35%~65% of a height of the bitline.

6. The semiconductor structure of claim 1, wherein the semiconductor structure further comprises:
- isolation structures disposed on sidewalls of the first silicide layer; and
- wherein the sidewalls are disposed on sidewalls of the second silicide layer and the sidewalls of the bitline not covered by the second silicide layer.

7. The semiconductor structure of claim 6, further comprising:
- a storage node contact structure, wherein the storage node contact structure is insulated from the first silicide layer by the isolation structures, and is insulated from the second silicide layer by spacers.

* * * * *